United States Patent [19]

Wu et al.

[11] Patent Number: 5,607,542
[45] Date of Patent: Mar. 4, 1997

[54] INDUCTIVELY ENHANCED REACTIVE ION ETCHING

[75] Inventors: Robert Wu, Pleasanton; Gerald Z. Yin, Cupertino, both of Calif.

[73] Assignee: Applied Materials Inc., Santa Clara, Calif.

[21] Appl. No.: 333,004

[22] Filed: Nov. 1, 1994

[51] Int. Cl.$^6$ ............................................. C23F 4/00
[52] U.S. Cl. ................. 156/643.1; 216/71; 118/723 I; 156/345; 315/111.51
[58] Field of Search ................. 156/643.1, 345; 118/723 E, 723 ER, 723 I; 427/457; 204/298.34, 298.06; 315/111.21, 111.51; 216/71

[56] References Cited

U.S. PATENT DOCUMENTS

| | | | |
|---|---|---|---|
| H566 | 1/1989 | Nyaiesh et al. | 118/723 IR |
| 3,057,795 | 10/1962 | Fröhlich | 118/723 I |
| 4,810,935 | 3/1989 | Boswell | 118/723 IR |
| 4,844,775 | 7/1989 | Keeble | 118/723 I |
| 5,146,137 | 9/1992 | Gesche et al. | 315/111.51 |
| 5,241,245 | 8/1993 | Barnes et al. | 315/111.51 |
| 5,391,260 | 2/1995 | Makino et al. | 156/345 |
| 5,401,350 | 3/1995 | Patrick et al. | 118/723 I |
| 5,436,528 | 7/1995 | Paranjpe | 315/111.51 |
| 5,449,432 | 9/1995 | Hanawa | 118/723 I |
| 5,458,732 | 10/1995 | Butler et al. | 118/723 I |
| 5,460,689 | 10/1995 | Raaijmakers et al. | 156/345 |
| 5,460,707 | 10/1995 | Wellerdieck | 156/345 |

FOREIGN PATENT DOCUMENTS

| | | |
|---|---|---|
| 507885 | 10/1992 | European Pat. Off. . |
| 57-027033 | 2/1982 | Japan . |
| 02096332 | 4/1990 | Japan . |
| 06089880 | 3/1994 | Japan . |

*Primary Examiner*—R. Bruce Breneman
*Assistant Examiner*—George Goudreau
*Attorney, Agent, or Firm*—Peter J. Sgarbossa; Noel F. Heal

[57] ABSTRACT

A method and apparatus for generating a medium density plasma in a reactive ion etching chamber. A conventional reactive ion etching technique, using multiple electrodes for capacitive coupling of power into the chamber to establish and sustain a plasma, is combined with inductive coupling for plasma enhancement only. A first source of high frequency power is coupled to at least one of the electrodes to generate the plasma under conditions similar to those used in a conventional reactive ion etching system, and a second source of high frequency power is coupled to an inductive coil surrounding the plasma, to enhance the plasma density without adversely affecting wafers being processed in the chamber.

20 Claims, 1 Drawing Sheet

INDUCTIVELY ENHANCED REACTIVE ION ETCHING

BACKGROUND OF THE INVENTION

This invention relates generally to plasma generation techniques, particularly as used in a dry etching process in the fabrication of integrated semiconductor devices. In dry etching, process gases are supplied to a vacuum chamber and radio-frequency (rf) energy generates and sustains a plasma cloud within the chamber. Ions in the plasma cloud bombard a workpiece, usually in the form of a semiconductor wafer, which may be located in the chamber immediately adjacent to the plasma, or in a separate processing chamber into which ions from the plasma are drawn. The ions either etch the workpiece or assist the etching, and the etching process may be made selective by patterning a protective coating applied to the workpiece prior to etching.

In general, there are three types of plasma generation approaches: capacitive, inductive, and microwave. In the more conventional capacitive plasma approach, the plasma is formed between a pair of parallel plate electrodes, to which radio-frequency (rf) energy is applied, to one or both plates. A variant of the parallel plate approach is the magnetically enhanced reactive ion etch (MERIE) plasma generation apparatus, in which a magnetic field enhances the formation of ions in the plasma. Both the parallel plate configuration and the MERIE configuration typically use a single rf power generator. Inductive plasma generators use an inductive coil, either a planar coil, a cylindrical coil or any of various other types of coils to deliver rf power into the plasma chamber. A separate rf generator supplies energy to at least one plate electrode in the chamber, to control ion energy and direction.

Magnetic enhancement (MERIE) has been an extremely successful etching technique for sub-micron and sub-half-micron devices of various types. The process provides good etch profile control excellent reproducibility and process robustness. However, MERIE suffers from a drawback that results directly from the use of a magnetic field in the plasma. Under the influence of the magnetic field, electrons in the plasma tend to drift in one direction, while positive ions in the plasma tend to drift in the opposite direction. As a result, charge distribution in the plasma becomes laterally non-uniform and charge distribution on a wafer being etched is similarly non-uniform. This can cause wafer damage because a capacitor formed on the wafer, or any other device on the wafer having capacitive characteristics, can break down if the accumulated charge on the wafer reaches a threshold level. This device charging effect limits the magnetic field strength in some MERIE systems to about 30–50 gauss, and up to 200 gauss in other MERIE systems. Further, the etch process may need to be operated at a higher pressure regime than conventional reactive ion etch (RIE) systems, to minimize damage.

Another disadvantage of the MERIE process is that it has to be operated with a relatively high direct current (dc) bias between the parallel-plate electrodes. As a result, high-energy ions impinging on the waist may "splash" material onto sidewalls of structures, such as vias, being etched into the water. Thicker sidewalls formed during high-bias etching are, therefore, an undesired result of the MERLE process.

Inductively coupled plasma (ICP) reactors are generally considered to be a newer technology as compared to RIE or MERIE types of plasma reactors. The inductively coupled plasma uses an inductive rf coil to generate a higher density plasma ($\geq 5$ mA/cm$^2$) at a low pressure (<30 mTorr). The reactors also have at least one electrode with the wafer placed on it and this electrode is capacitively powered by a second rf generator. The first inductive rf generator defines the density of the plasma and the second rf generator controls the ion energy.

The advantage of an inductively coupled plasma (ICP) reactor is to decouple ion energy control from ion density control, and a wider process latitude is usually obtained for metal and polysilicon etching because the chemical nature of the plasma and because of the independent controls of ion energy and ion density. The process "window" is, therefore, much wider and selectivity to the underlayer of the workpiece is significantly higher. However, selectivity to a photomask (i.e., the ability of the reactor to etch only selected areas t,f a workpiece through a mask having a photolithographically formed pattern) is usually lower than for a high pressure RIE or MERIE system.

For dielectric etching, the process is ion driven dominated etching, which is quite different from that of metal and polysilicon etching. Typical inductive or microwave generated plasma oxide etchers, operating at low pressure (approximately a few mTorr) have completely different characteristics from metal and polysilicon high density etchers. At low pressure, especially for high selectivity contact, via or self-aligned contact (SAC) process applications, by-product polymer is deposited over the entire inside chamber wall. The deposited polymer is not only a major particle source but significantly changes the baseline process and causes a high transient effect. The chamber wall can be heated to minimize deposition but the temperature has to be quite high (>235° C.) to be effective. Also, an inductively coupled plasma (ICP) requires high rf power input, which drives the chamber temperature high ($\geq 200$° C.–300° C.). Process stability becomes extremely sensitive in this environment. A further disadvantage of ICP is that etch rate microloading is worse for ICP than for RIE or MERIE (i.e., the etch rate in a small space is usually lower than the etch rate in large spaces). Also, the sidewall passivation with ICP processing is usually thinner than with RIE or MERIE at higher pressure. As a result the profile tolerance for a long overetch is poor.

It will be appreciated from the foregoing that there is still a need for improvement over RIE, MERIE and ICP processes. Ideally, it would be desirable to provide a system with a medium density plasma (MDP) without all the drawbacks of the high density plasma, and yet retaining all the advantages of the traditional MERIE and RIE etchers. As further explained below, the present invention is directed to these ends.

SUMMARY OF THE INVENTION

The present invention provides a method and apparatus for plasma etching, with medium density plasma (MDP) enhanced with the aid of an inductive coil. Briefly, and in general terms, the method of the invention comprises the steps of introducing process gases into a vacuum chamber; applying radio-frequency power to electrodes in the chamber and thereby establishing a plasma in the chamber by capacitive coupling; and applying radio-frequency power to an inductive coil surrounding the plasma, to enhance plasma density without the creation of a non-uniform charge distribution over an electrode or workpiece that can damage workpieces being processed. The power applied to the inductive coil to enhance the plasma density is smaller than, or at least not significantly higher than the power applied to the electrodes to establish and maintain the plasma. The method also includes the step of maintaining the pressure in the chamber at a level comparable with pressures used in conventional reactive ion etch processes, rather than typical inductively coupled plasma (ICP) systems. In the preferred embodiment of the method, the pressure in the chamber is maintained at a level in the approximate range 30 mTorr to 1 Torr. In one preferred embodiment of the invention, power is coupled to the plasma through a pair of parallel-plate electrodes, one of which also supports a workpiece to be processed. The inductive coil to which power is applied is located outside the chamber, and at least a portion of the vacuum chamber is made of an insulating material.

The medium density plasma (MDP) etcher of the invention avoids the drawbacks of high density plasma systems but retains the advantages of conventional MERIE and RIE etchers. Advantages of the MDP etcher include: better microloading control between small and large features, elimination of device charge-up damage due to non-uniformity of ion/electron density under the influence of a magnetic field, provision of adequate sidewall passivation for anisotropic etching, a wide process window, a low transient effect with less wall/roof interaction with the plasma, a stable and reproducible process, a low total power consumption, and a moderate operating temperature (100°–150° C.).

In an illustrative embodiment of the invention, the power applied to the electrodes is approximately in the range 500 watts to 3 kilowatts and the power applied to the inductive coil is approximately in the range 100 watts to 1,200 watts.

The apparatus of the invention is an inductively enhanced reactive ion etch plasma generator, comprising a vacuum chamber, including means for introducing and removing process gases; multiple electrodes located in the vacuum chamber; a source of radio-frequency (rf) power applied to at least one of the electrodes, to deliver power to establish and sustain a plasma in the chamber; an inductive coil positioned to surround the plasma; and a second source of rf prover selected to deliver a relatively low power to the inductive coil, to enhance ion density in the plasma. The enhancement of ion density is achieved without unwanted charge build-up effects on the electrodes or on a workpiece being processed. In one embodiment of the apparatus, the electrodes are a pair of parallel-plate electrodes, one of which also supports a workpiece to be processed. The inductive coil to which power is applied is located outside the chamber, at least a portion of which is of an electrically insulating material.

It will be appreciated from the foregoing that the present invention represents a significant advance in the filed of plasma generators. In particular, the plasma generator of the invention provides the same advantages as a magnetically enhanced reactive ion etch (MERIE) system, including the advantages over an inductively coupled plasma (ICP) system, but without the unwanted disadvantages associated with MERIE and ICP systems. Other aspects and advantages of the invention will become apparent from the following more detailed description.

DESCRIPTION OF THE PREFERRED EMBODIMENT

Figure 1:
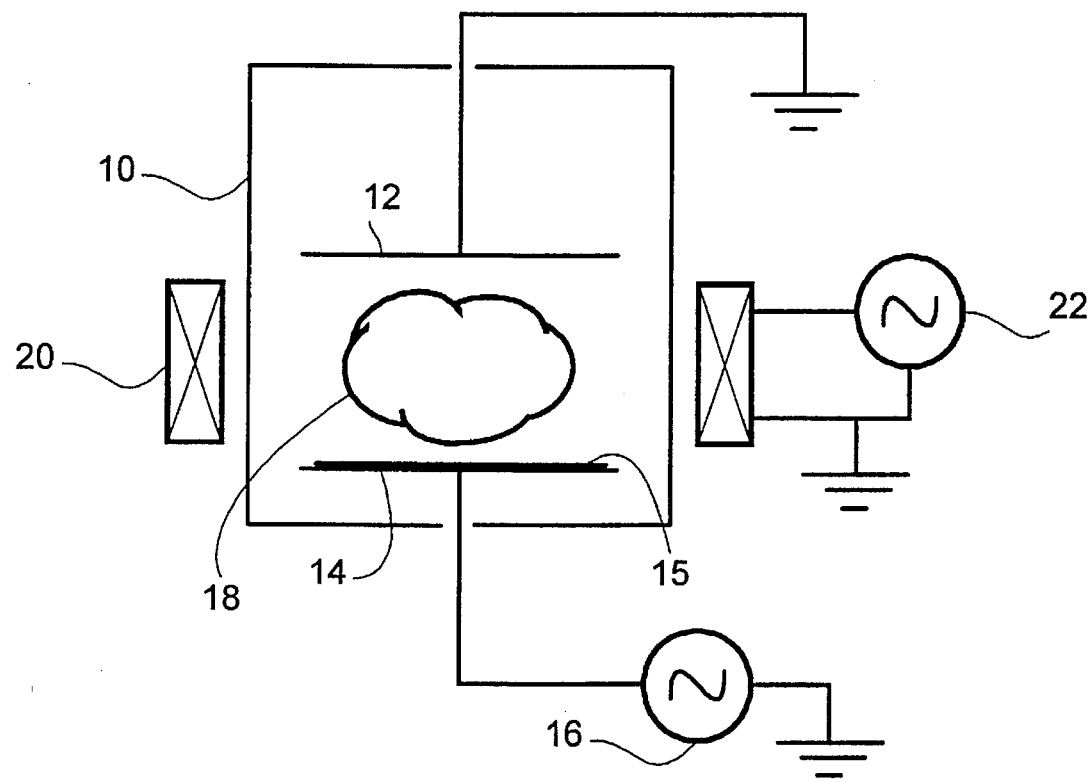
FIG. 1 is a diagrammatic view of an inductively enhanced reactive ion etch system in accordance with the invention.

As shown in the drawing by way of illustration, the present invention pertains to an RIE (reactive ion etching) system in which a plasma is generated and sustained by capacitive coupling, but ion density, as well as ion energy, in the plasma is enhanced by inductive coupling. Gas introduced into a plasma reactor dissociates into reactive species and forms a plasma that includes ions, which are accelerated toward a workpiece by an electric field, resulting in etching of the workpiece. In conventional plasma generation techniques, the plasma is generated and maintained either by capacitively coupled, inductively coupled, or microwave coupled energy. By far the most common approach uses capacitive coupling of radio-frequency (rf) energy through parallel-plate electrodes. A magnetic field may be used to enhance the density of the plasma, but the presence of the magnetic field poses additional problems, principally device damage caused by a non-uniform charge distribution.

Conventional reactive ion etch (RIE) technology uses capacitive coupling to supply power to generate and maintain the plasma. Typical operating pressures are in the range from 200 milliTorr (mTorr) to about 2 Torr. At lower pressures, particularly below 200 mTorr, the plasma density usually gets too low and the etch rate is too low for many purposes. Therefore, the traditional RIE mode has been supplanted in many applications by magnetically enhanced RIE, or MERIE technology, using a fixed or rotating magnetic field. Power is still coupled into the plasma primarily by capacitive coupling, while the magnetic field is used primarily to enhance the plasma density. Such MERIE systems produce higher plasma densities and can operate at lower pressures. However, device charge build-up problems limit the strength of the magnetic field that can be used for enhancement, and the etch process is often performed at a higher pressure regime to balance the effect of a high dc bias with a relatively lower plasma density.

By way of further background, it will be understood that the etch rate resulting from ions accelerated from the plasma onto a wafer is dependent on a variety of interrelated parameters, including the power or voltage applied to the powered electrode, the frequency of the rf power applied to the electrode, the pressure in the chamber, the selection and flow rate of process gases, the temperature of the surface being etched, the specific materials being etched, and so forth. The applied power affects the electron energy distribution, which, as a result of collisional processes, also affects the generation of ions in the plasma. Therefore, etch rates generally increase with applied power. If the pressure is increased at a constant flow rate of process gases, the residence time and particle collision rate will increase and the electron energy will decrease. Since the electron energy determines the rate of generation of ions, the plasma density and the resulting etch rate will decrease with increasing pressure. The etch rate is dependent both on the plasma density (the density of ions available for etching) and the energy of ions accelerated from the plasma. The average ion energy is determined by the plasma potential and the dc bias produced on the lower electrode supporting the wafer. The dc bias increases with increased applied voltage or power, and is also approximately proportional to a power of the ratio of the area of the anode (upper electrode) to the area of the cathode (lower electrode). Specifically, the proportionality is given by: $V_{DC}=f(A_A/A_C)^n$, where f is the frequency and n is a constant, usually in the range of 3–4. In a conventional RIE system and in a magnetically enhanced RIE system, the upper electrode is electrically connected to the vacuum chamber, which is grounded, so the area ratio and the resulting dc bias is relatively large.

Although one might suppose that it would be simple matter to select appropriate parameters to achieve a desired etch rate without unwanted consequences, in practice it has proved to be difficult to provide an ideal plasma generation system. MERIE technology provides an increased plasma density but the degree of enhancement is limited because the magnetic field results in unwanted charge build-up in the wafers being processed, and consequently a high dc bias on the wafer and high ion energy of the magnetically enhanced system cause thickened sidewalls on vias and other structural features on the processed wafer.

Coupling energy to the plasma by induction rather than by capacitive coupling, as in MERIE or RIE systems, avoids some of these problems but is more costly because it requires an inductive coil capable of delivering high power to the plasma; furthermore, the vacuum chamber must be operated at a lower pressure.

In accordance with the present invention, a conventional capacitive coupling approach is used to generate and sustain the plasma, and is combined with inductive coupling to enhance the density of the plasma to a level between the density of ICP systems and that of conventional RIE and MERIE systems. For this reason, the plasma etching system of the present invention is referred to as a medium density plasma (MDP) etcher. FIG. 1 shows diagrammatically how the invention is implemented in a typical parallel-plate configuration using capacitive coupling to generate and sustain the plasma. A processing vacuum chamber, indicated by reference numeral 10 encloses an upper plate electrode 12 and a lower plate electrode 14. The lower electrode 14 typically supports a semiconductor wafer or substrate 15 by a mechanical chuck, an electrostatic chuck, or other means (none or which are shown). Energy is capacitively coupled into the chamber 10 from a first radio-frequency (rf) generator 16 connected to at least one of the plates 12 and 14. Process gases are admitted into the chamber 10 through an appropriate port (not shown), and gases are evacuated from the chamber through another conventional port (not shown). A plasma, indicated diagrammatically by the cloud shape 18, is formed between the plates 12 and 14 when the rf generator 16 is activated. Particles from the plasma are accelerated into the surface of the wafer 15 to perform a desired etching process on the wafer. The energy of these particles, which are typically ions formed from the process gas, is determined largely by a direct-current (dc) bias developed on the lower plate 14. The dc bias depends on a power of the ratio of the upper electrode area to the lower electrode area. In a conventional capacitively coupled configuration, the upper electrode 12 is grounded and the entire chamber 10 is grounded. Therefore, there is a relatively large dc bias on the lower electrode 14. As discussed above, a high bias typically leads to thickened sidewalls during the etching process.

In the present invention, a portion of the chamber 10 wall, where power is to be coupled inductively into the chamber, is an insulator. The remaining portion of the chamber is made of a conductive material, which can be electrically floating or grounded, depending on dc bias voltage requirements for certain applications. An induction coil 20 surrounds the chamber 10 at a region between the plates 12 and 14, which region includes the insulative portion of the chamber 10. Coil 20 is supplied with power from a second rf generator 22, has only a few turns of conductive wire, for example 3–7 turns, and provides a relatively small power level to the plasma, for example a few hundred watts. The first rf generator 16 supplies a power of, typically, 100 watts to 1,200 watts for wafers of 6-inch or larger diameter, and can be operated at any frequency commonly used in reactive ion etching, such as 13.56 MHz, 2 MHz or 400 kHz. The inductive coil 20 may also use any conveniently available frequency.

By way of further example, the invention may be embodied in a system for processing 8-inch wafers, in which the first rf generator 16 operates at a frequency of 13.56 MHz, the second rf generator 22 operates at a frequency of 400 kHz and the inductive coil 20 has 4½ turns. In another exemplary embodiment, the first rf generator 16 operates at a frequency of 2 MHz and the second rf generator 22 operates at a frequency of 1.8 MHz. Of course, these parameters are only examples and it appears that the principle of the invention may be implemented using operating parameters selected from a broad range of values.

A structure similar to that shown in FIG. 1 may be operated as an ICP plasma reactor, at very low pressures (1–20 mTorr), and with the inductive coil supplied with much higher powers (500 watts to 3 kw) than in the present invention, to couple energy inductively into the chamber for plasma generation. The rf power applied to the bottom plate 14 controls the energy of ions used for etching the wafer. A high plasma density is obtained as a result of the low pressure and inductively coupled plasma generation power.

Although the use of inductive coupling for plasma generation, as in ICP systems, is satisfactory for many applications, the present invention provides an alternative solution using conventional RIE technology as a basis, and providing plasma enhancement through inductive coupling. The process regime used in the invention is advantageously very close to that of the traditional RIE technology. The pressure used is approximately in the range 30 mTorr through 1 Torr, and is preferably in the range 30–300 mTorr. This is in contrast to the much lower pressures (1–20 mTorr) used in an inductively coupled plasma (ICP) generator.

Plasma enhancement using inductive coupling has the same effect as magnetic enhancement, and increases the plasma density by a factor of at least two or three as compared with operation in the conventional RIE mode. The plasma density for RIE and MERIE etchers is on the order of $10^9$–$10^{10}$ ions/cm$^3$ (cubic centimeter). For ICP systems, the plasma density is on the order of $10^{12}$ ions/cm$^3$, and for the MDP etcher of the present invention the plasma density is on the order of $10^{11}$ ions/cm$^3$. Unlike plasma enhancement by use of a fixed or rotating magnetic field (MERIE), the direction of the electromagnetic field generated by the inductive coil in the present invention alternates with its rf power supply and there is no magnetic field-induced plasma drift or non-uniformity of charge distribution in the plasma.

In addition to eliminating the charge build-up problem associated with magnetically enhanced plasma generators, the present invention has additional benefits. Because the conventional parallel-plate RIE configuration can be retained, a uniform and collimated electric field is easily and advantageously provided. Also, the invention is less expensive to implement than a system that uses inductive coupling for the primary plasma power source, because the inductive coil needs to handle less power. Another advantage is that the relatively high operating pressure avoids the need for high-capacity vacuum pumps to evacuate the chamber, which also helps to minimize cost and complexity. Moreover, the invention provides a high etch rate at a relatively high pressure and operates at a lower dc bias than magnetically enhanced plasma generators.

It will be appreciated from the foregoing that the present invention represents a significant improvement in plasma generation techniques. In particular, the invention provides for plasma generation using the same operating regime as in conventional RIE technology, but also provides for plasma density enhancement using inductive coupling and avoiding the disadvantages of a magnetically enhanced system. A further advantage of the invention is that it enhances ionization in the plasma but does not generate excessive heat. Yet another advantage is that a system can easily be configured to switch back and forth between an inductively enhanced mode of operation and a conventional RIE mode of operation. It will also be appreciated that, although a specific embodiment of the invention has been described by way of illustration, the invention also encompasses modified versions of the illustrative embodiment. For example, the plasma may be generated by other configurations of parallel plates, such as pairs of vertical plates instead of horizontal plates. Accordingly, the invention should not be limited except as by the claims that follow.

We claim:

1. A medium density plasma generation method, comprising the steps of:

introducing process gases into a vacuum chamber;

applying radio-frequency power to electrodes in the chamber and thereby establishing a plasma in the chamber by capacitive coupling; and applying radio-frequency power to an inductive coil surrounding the plasma, to enhance plasma density without a pure magnetic field enhancement induced non-uniform charge distribution that can damage workpieces being processed;

wherein the power applied to the inductive coil to enhance the plasma density is smaller than the power applied to the electrodes to establish and maintain the plasma.

2. A medium density plasma generation method as defined in claim 1, and further comprising the step of:

maintaining the pressure in the chamber at a level in the range 30 mTorr to 1 Torr, which is comparable with pressures used in conventional reactive ion etch processes.

3. An inductively enhanced reactive ion etch plasma generator, comprising:

a vacuum chamber adapted to intake and remove process gases;

a plurality of electrodes within said chamber;

a first source of rf power for application to at least one of said electrodes enabling the capacitive coupling of power into the chamber to sustain a plasma within an interior volume thereof;

an inductive coil positioned about said interior volume; and a second source of rf power connected to said coil to couple a selected level of rf power into said chamber to enhance ion density of the plasma inductively, while minimizing non-uniform charge distribution normally associated with magnetic plasma enhancement, and wherein said second source of rf power delivers less power than said first source of rf power.

4. A medium density plasma generation method as defined in claim 2, wherein:

the pressure in the chamber is maintained at a level in the range 30 mTorr to 300 mTorr.

5. A medium density plasma generation method as defined in claim 1, wherein the step of applying power to the electrodes includes:

applying power to a pair of parallel-plate electrodes, one of which also supports a workpiece to be processed.

6. A medium density plasma generation method as defined in claim 1, wherein:

the inductive coil to which power is applied is located outside the chamber.

7. A medium density plasma generation method as defined in claim 1, wherein:

the power applied to the electrodes is in the range 500 watts to 3 kilowatts; and the power applied to the inductive coil is in the range 100 watts to 1,200 watts.

8. An inductively enhanced reactive ion etch medium density plasma generator, comprising:

a vacuum chamber, including means for introducing and removing process gases;

multiple electrodes located in the vacuum chamber;

a first source of radio-frequency (rf) power applied to at least one of the electrodes, to deliver power to establish and sustain a plasma in the chamber;

an inductive coil positioned to surround the plasma in the chamber; and a second source of rf power selected to deliver power to the inductive coil, to enhance ion density in the plasma, wherein the second source of rf power delivers a lower level of power than the first source of rf power;

wherein the enhancement of ion density is achieved without unwanted charge build-up effects on the electrodes or on a workpiece being processed, these effects being caused by non-uniformities of charge distribution in the plasma, resulting from the use of fixed or rotating magnetic fields for plasma enhancement.

9. An inductively enhanced reactive ion etch plasma generator as defined in claim 8, wherein:

the pressure in the chamber is maintained at a level in the range 30 mTorr to 1 Torr.

10. An inductively enhanced reactive ion etch medium density plasma generator plasma generator as defined in claim 9, wherein:

the pressure in the chamber is maintained at a level in the range 100 mTorr to 300 mTorr.

11. An inductively enhanced reactive ion etch medium density plasma generator as defined in claim 8, wherein:

the electrodes are a pair of parallel-plate electrodes, one of which also supports a workpiece to be processed.

12. An inductively enhanced reactive ion etch medium density plasma generator as defined in claim 8, wherein:

the inductive coil to which power is applied is located outside the chamber.

13. An inductively enhanced reactive ion etch medium density plasma generator as defined in claim 8, wherein:

the power applied to the electrodes is in the range 1–3 kilowatts; and the power applied to the inductive coil is in the range 100 watts to 1,200 watts.

14. A plasma generator as defined in claim 3, in which said chamber includes two electrodes in spaced parallel relationship, one of which is adapted to support a workpiece to be processed.

15. A plasma generation method for inductively-enhanced reactive ion etch of a substrate, comprising the steps of:

introducing process gases into a vacuum chamber;

supporting a substrate upon an electrode within the chamber;

applying rf power to said electrode within the chamber to capacitively couple the power into the chamber such that a plasma from said process gases is sustained within an interior volume of the chamber to supply reactive charged particles of the process gases to etch the substrate; and applying rf power to an inductive coil positioned about the interior volume in which the plasma is sustained, to enhance plasma ion density inductively, while minimizing non-uniform charge distribution normally associated with magnetic plasma enhancement, wherein the step of applying rf power to the inductive coil couples less power to the plasma than the step of applying rf power to said electrode.

16. A plasma generator as defined in claim 3, in which said coil is comprised of an elongated conductor arranged about said interior volume in from one to ten turns.

17. A plasma generation method as defined in claim 15, in which the inductive coil is provided by winding between one and ten turns of an elongated conductor about the interior volume.

18. A plasma generation method as defined in claim 15, in which the capacitively-coupled power is applied between two generally parallel electrodes, one of which is the electrode supporting the substrate.

19. A plasma generation method as defined in claim 15, in which rf power is applied to the inductive coil at a frequency in the range of 100 kHz to 20 MHZ or more.

20. A plasma generation method as defined in claim 15, in which rf power is applied to the electrode at a frequency in the range of 100 kHz to 20 MHZ or more.

* * * * *